United States Patent
Aghoram et al.

(10) Patent No.: US 11,081,558 B2
(45) Date of Patent: Aug. 3, 2021

(54) LDMOS WITH HIGH-K DRAIN STI DIELECTRIC

(71) Applicant: TEXAS INSTRUMENTS INCORPORATED, Dallas, TX (US)

(72) Inventors: Umamaheswari Aghoram, Richardson, TX (US); Pushpa Mahalingam, Richardson, TX (US); Alexei Sadovnikov, Sunnyvale, CA (US); Eugene C Davis, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/812,311

(22) Filed: Mar. 8, 2020

(65) Prior Publication Data

US 2020/0212188 A1    Jul. 2, 2020

Related U.S. Application Data (62) Division of application No. 15/720,616, filed on Sep. 29, 2017, now Pat. No. 10,593,773.

(51) Int. Cl.
*H01L 29/423* (2006.01)
*H01L 21/02* (2006.01)
(Continued)

(52) U.S. Cl.
CPC .. *H01L 29/42336* (2013.01); *H01L 21/02439* (2013.01); *H01L 21/02502* (2013.01); *H01L 21/76224* (2013.01); *H01L 29/0653* (2013.01); *H01L 29/221* (2013.01); *H01L 29/402* (2013.01); *H01L 29/66689* (2013.01);
(Continued)

(58) Field of Classification Search
CPC ......... H01L 29/66681; H01L 29/66659; H01L 29/7816; H01L 29/7835; H01L 21/02439; H01L 21/02502; H01L 21/761; H01L 21/76224; H01L 29/0653; H01L 29/1083; H01L 29/1087; H01L 29/221; H01L 29/402; H01L 29/42336; H01L 29/66689
See application file for complete search history.

(56) References Cited

U.S. PATENT DOCUMENTS 6,054,343 A    4/2000  Ashburn
6,251,746 B1   6/2001  Hong et al.
(Continued)

OTHER PUBLICATIONS

Huo, W.R., et al., "Analysis and Fabrication of an LDMOS With High-Permittivity Dielectric," IEEE Electron Device Letters, Sep. 2011, pp. 1266-1268, vol. 32, No. 9.
(Continued)

*Primary Examiner* — David C Spalla
(74) *Attorney, Agent, or Firm* — Andrew R. Ralston; Charles A. Brill; Frank D. Cimino (57) ABSTRACT

A laterally diffused metal oxide silicon (LDMOS) transistor and a method of making the LDMOS transistor are disclosed. The LDMOS transistor includes a drain drift region formed in a substrate and containing a drain contact region. A gate structure overlies a channel region in the substrate and a first shallow-trench isolation (STI) structure located between the drain contact region and the channel region. The first STI structure contains a high-k dielectric and a second STI structure contains silicon oxide.

22 Claims, 12 Drawing Sheets

(51) Int. Cl.
  *H01L 21/762* (2006.01)
  *H01L 29/06* (2006.01)
  *H01L 29/221* (2006.01)
  *H01L 29/40* (2006.01)
  *H01L 29/66* (2006.01)
  *H01L 29/78* (2006.01)
  *H01L 21/761* (2006.01)
  *H01L 29/10* (2006.01)

(52) U.S. Cl.
  CPC ...... *H01L 29/7816* (2013.01); *H01L 29/7835* (2013.01); *H01L 21/761* (2013.01); *H01L 29/1083* (2013.01); *H01L 29/1087* (2013.01)

(56) References Cited

U.S. PATENT DOCUMENTS

| | | | |
|---|---|---|---|
| 9,443,967 B1 * | 9/2016 | Chan | H01L 29/0878 |
| 2011/0108916 A1 | 5/2011 | Calabrese et al. | |
| 2012/0199904 A1 * | 8/2012 | Sasaki | H01L 29/7816 |
| | | | 257/343 |
| 2013/0087828 A1 * | 4/2013 | Koshimizu | H01L 21/76224 |
| | | | 257/139 |
| 2016/0087087 A1 * | 3/2016 | Kub | H01L 29/7371 |
| | | | 257/26 |
| 2016/0149031 A1 | 5/2016 | Jung | |
| 2016/0155795 A1 * | 6/2016 | Feng | H01L 29/7816 |
| | | | 257/337 |
| 2016/0322262 A1 * | 11/2016 | Li | H01L 21/761 |
| 2017/0047338 A1 * | 2/2017 | Shinohara | H01L 21/3083 |

OTHER PUBLICATIONS

Li, Junhong, et al, "High Permittivity Dielectric LDMOS for Improved Performance," ICSGCE 2011 Energy Procedia, 2011, pp. 341-347, vol. 12.

Ya-Hong, Zhai, et al., "Lead zirconate titanate behaviors in an LDMOS," Chinese Physics B, 2013, pp. 078501-1-078501-4, vol. 22, No. 7.

* cited by examiner

FIG. 5

LDMOS WITH HIGH-K DRAIN STI DIELECTRIC

CROSS REFERENCE TO RELATED APPLICATIONS

This application is a divisional of U.S. patent application Ser. No. 15/720,616 filed Sep. 29, 2017, which is incorporated herein by reference in its entirety.

FIELD OF THE DISCLOSURE

Disclosed embodiments relate generally to the field of semiconductor devices. More particularly, and not by way of any limitation, the present disclosure is directed to a laterally diffused metal oxide silicon field effect transistor (LDMOS) with high dielectric constant (high-k) drain Shallow Trench Isolation (STI).

BACKGROUND

A high performance LDMOS transistor, which can be utilized as a power field effect transistor (FET), will have low on-resistance, $R_{ON}$, and high breakdown voltage, BV. Current processes dictate that to lower on-resistance, it is necessary to increase doping of the drain side drift region. However, such an increase in the drain side drift region doping results in a reduction in breakdown voltage, which is not acceptable. Greater decoupling of the intrinsic limit to the on-resistance of the power FET for a given breakdown voltage is needed.

SUMMARY

Disclosed embodiments provide a high-k dielectric for the drain side STI of the LDMOS. The high-k material in the STI provides for improved accumulation below the field plate, which lowers $R_{ON}$. The high-k material also reduces the electric field at the edge of the field plate and increases breakdown voltage for a given doping. If a higher breakdown voltage is not necessary, doping can be increased to further reduce $R_{ON}$ or else the drift region length can be reduced to further reduce $R_{SP}$ without compromising the breakdown voltage. Other STI on the chip can be implemented in either silicon dioxide or the same high-k dielectric, depending on the requirements of the device.

In one aspect, an embodiment of a laterally diffused metal oxide silicon (LDMOS) transistor is disclosed. The LDMOS transistor includes a drain drift region formed in a substrate and containing a drain contact region; a gate structure overlying a channel region in the substrate; a first shallow-trench isolation (STI) structure formed between the drain contact region and the channel region, the first STI structure comprising a high-k dielectric; and a second STI structure comprising silicon dioxide.

In another aspect, an embodiment of a laterally diffused metal oxide silicon (LDMOS) transistor is disclosed. The LDMOS transistor includes a drain drift region formed in a substrate and containing a drain contact region; a gate structure overlying a channel region in the substrate; a gate dielectric separating the gate structure from the channel region, the gate dielectric comprising silicon dioxide; a source region formed in the substrate; and a plurality of shallow-trench isolation (STI) structures in the substrate, the plurality of STI structures comprising a high-k dielectric.

In another aspect, an embodiment of a method of fabricating a laterally diffused metal oxide silicon (LDMOS) transistor in a first region of a wafer is disclosed. The method includes providing a wafer for which locations for a source region, a drain contact region and a gate region have been defined and having an extended drain region formed in the substrate; forming a first shallow trench isolation (STI) structure in the first region and filling the first STI structure with a first dielectric material; and forming a drain STI structure in the extended drain region of the LDMOS transistor and filling the drain STI structure with a second dielectric material that is different from the first dielectric material and that comprises a high-k dielectric.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A double-diffused MOS (DMOS) transistor is a power MOS transistor that has a double-diffused well (D-WELL) that forms the channel, and a large lightly-doped drain region, known as a drain drift region, which lies between the channel and a heavily-doped drain region. A lateral DMOS (LDMOS) transistor is a DMOS transistor where the source and drain regions are laterally spaced apart.

Figure 5:
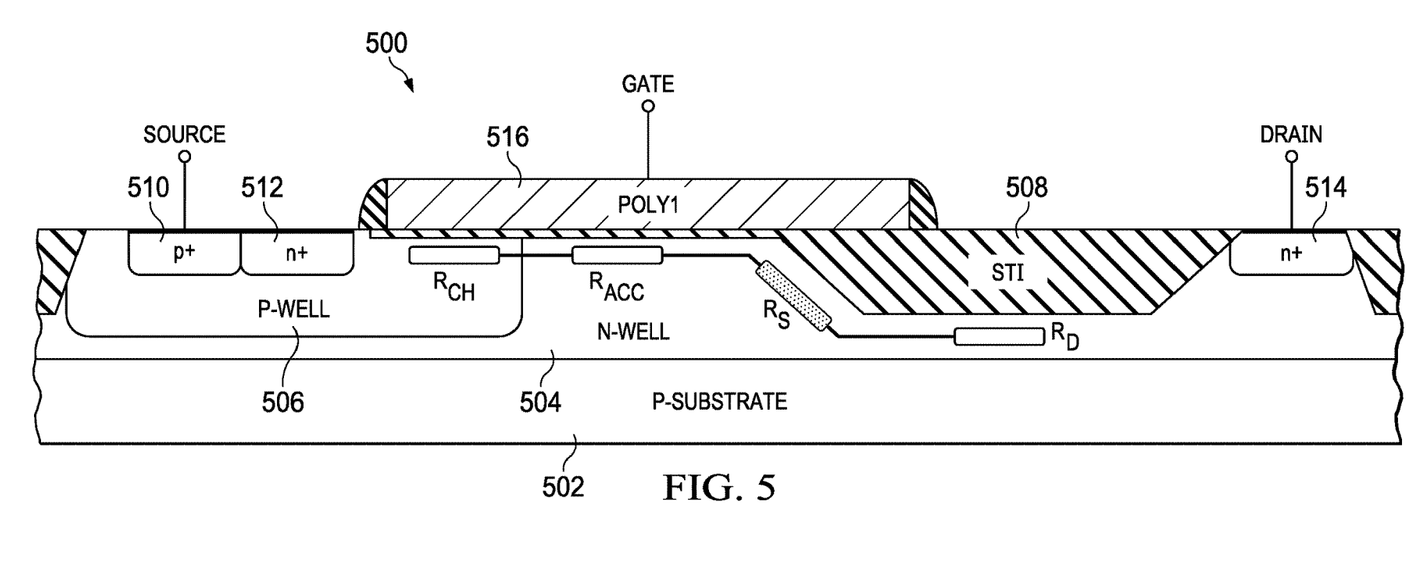
FIG. 5 depicts a schematic of an LDMOS transistor and illustrates the various resistances that make up the ON-resistance.

With reference first to FIG. 5, a schematic of an LDMOS transistor 500 is shown that identifies the separate elements that make up the ON resistance of the transistor. LDMOS transistor 500 includes an N-well 504 formed in a P-substrate 502. P-well 506 is formed within N-well 504 and contains P+ region 510 and N+ region 512, which forms the source. Drain region 514 is also formed in N-well 504 at a distance removed from source 512. STI structure 508 is formed between source 512 and drain 514 and forces the flow of electrons to move deeper into N-well 504. Polysilicon gate 516 overlies portions of P-well 506, N-well 504 and STI 508. As shown by the illustrated chain of resistances, four elements combine to form the ON resistance $R_{ON}$: channel resistance $R_{CH}$, accumulation resistance $R_{ACC}$, spread resistance $R_S$ and drift resistance $R_D$, i.e., $$R_{ON}=R_{CH}+R_{ACC}+R_S+R_D.$$

In the present application, Applicants utilize a high-k dielectric material in the drain STI, which accomplishes two objectives. First, the use of the increased permittivity causes greater accumulation under the field plate region, which decreases the spread resistance $R_S$. Second, the high-k dielectric reduces the electrostatic field crowding at the edge of the field plate, which increases the breakdown voltage. Unlike the older paradigm in which improvements to ON resistance must be balanced with the decrease in breakdown voltage, the disclosed embodiments provide improvements to both ON resistance and breakdown voltage.

In one embodiment, the replacement of the STI oxide with a high-k dielectric includes only the drain STI of the LDMOS. This can be beneficially incorporated, for example, into existing process flows, and can include process flows that include not only LDMOS transistors, but also CMOS transistors, whose parameters would be affected by changes to the STI dielectric. In another embodiment, all of the STI dielectric across a chip is implemented using a high-k dielectric, while other dielectrics, e.g., a gate dielectric, remain implemented in silicon dioxide. Note that while the device and process are both described with reference to an LDMOS technology that utilizes deep trench isolation, deep trench isolation is not necessary for the practice of the disclosed embodiments. In one embodiment, the isolation between devices is junction isolation; in yet another embodiment, the isolation between devices is STI.

Figure 1:
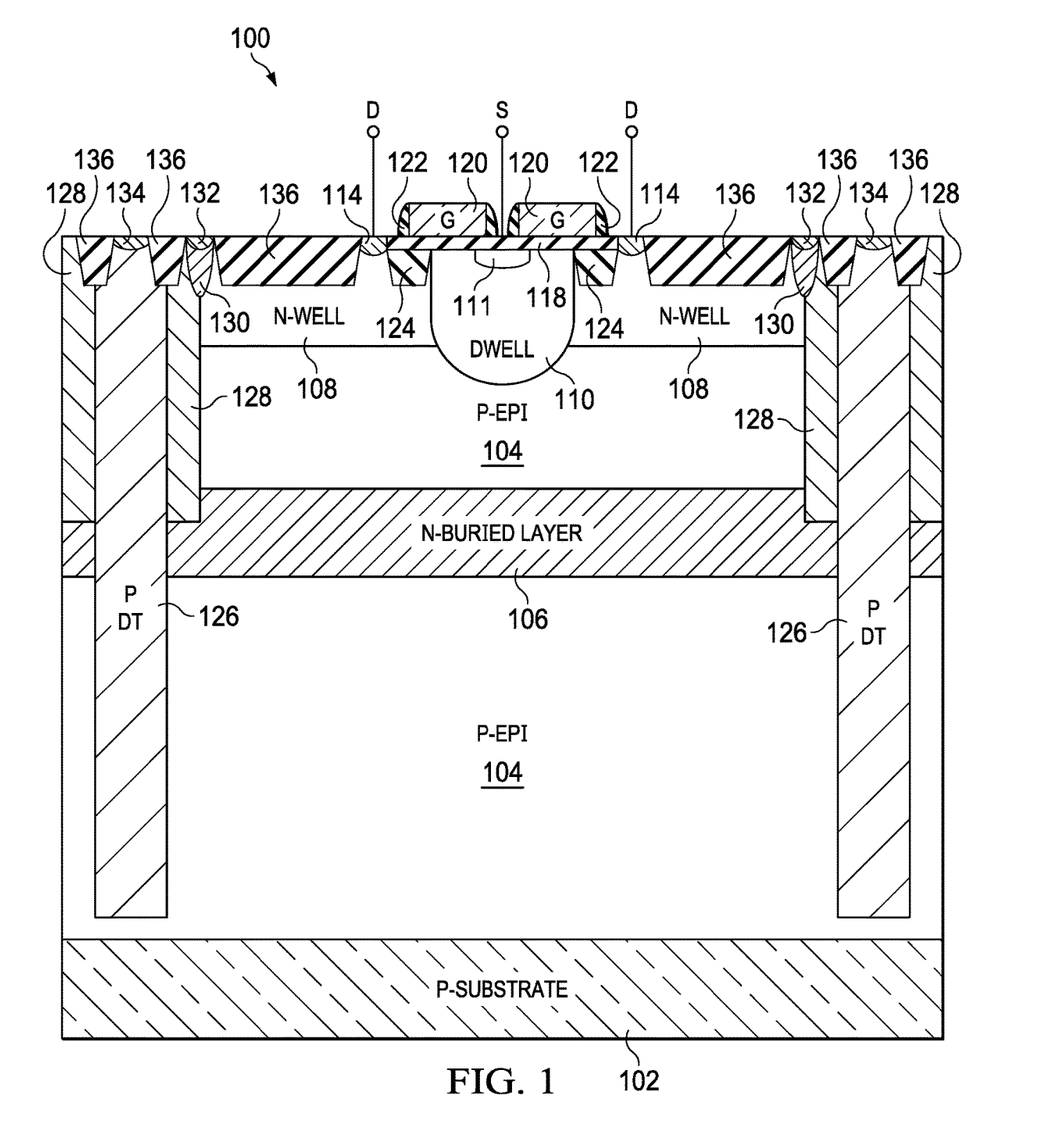
FIG. 1 depicts an example of an LDMOS transistor according to an embodiment of the disclosure.

FIG. 1 depicts a cross-section of an LDMOS transistor 100 that has a racetrack gate. It will be understood that this embodiment is only an example of the use of this technology and is not meant to be limiting. In the embodiment shown, LDMOS transistor 100 includes a P-type single-crystal-silicon substrate 102 and a P-type epitaxial layer 104 that is grown over substrate 102. An N-type buried layer 106 is formed within P-type epitaxial layer 104. In one embodiment, N-type buried layer 106 is a blanket implantation across the chip. LDMOS transistor 100 also includes an N-well region 108 that forms a drain drift region and an N+ drain contact region 114. In addition, LDMOS transistor 100 contains a double-diffused well (D-well) 110 that is formed in epitaxial layer 104. An N+ source region 111 is formed at a central location adjacent the surface of D-well 110. At the same time that drain contact region 114 is formed, N+ contact regions 130/132 are formed to contact N-type buried layer 106 through deep N-well 128. A P+ contact region 134 provides a similar electrical connection to the P-epitaxial layer 104 through P deep trench structure 126.

Two types of isolation structures are illustrated in LDMOS transistor 100. In this embodiment, LDMOS transistor 100 is separated from surrounding structures by deep trench isolation, which in the embodiment shown comprises P-type deep trenches 126, which extend greater than 10 microns into epitaxial layer 104. In one embodiment, the illustrated LDMOS transistor 100 is part of an array of LDMOS transistors, arranged in rows and columns and the surrounding structures are other LDMOS transistors. On either side of deep trench 126 is a self-aligned deep N-well region 128, which provides electrical contact to the N-type buried layer 106. Within LDMOS transistor 100, shallow trench isolation 124, 136 is utilized to provide separation of the elements. The drain STI 124, which separates the gate and drain of transistor 100, is filled with a high-k dielectric, while other STI 136 within transistor 100 are filled with silicon dioxide.

As used herein, "high-k dielectric" refers to a dielectric material having a dielectric constant greater than silicon dioxide. In one embodiment, the high-k dielectric is silicon nitride, $Si_3N_4$, which has a dielectric constant of 7.9 (silicon oxide has a dielectric constant of 5 and silicon dioxide has a dielectric constant of 3.9). Other high-k materials that can be utilized include $Al_2O_3$ (k=9.5-12), $BaTiO_3$ (k=130-1000), PZT (k=300-4000), $HfO_2$ (k=40), $TaO_5$ (k=27), $WO_3$ (k=42), and $ZrO2$ (k=25).

In one embodiment, the chip in which LDMOS transistor 100 is formed also contains CMOS transistors (not specifically shown). In this embodiment, the STI in the CMOS transistor region are implemented using silicon dioxide so that the parameters of the CMOS transistors are not changed and the process flow for fabricating the chip changes as little as possible. A gate oxide 118 overlies D-well 110 and gate 120 overlies portions of D-well 110 and source 111; gate 120 typically includes sidewall spacers 122. In one embodiment, as shown FIG. 1, gate 120 extends laterally over a portion of drain STI 124 to form a field plate.

Figure 1A:
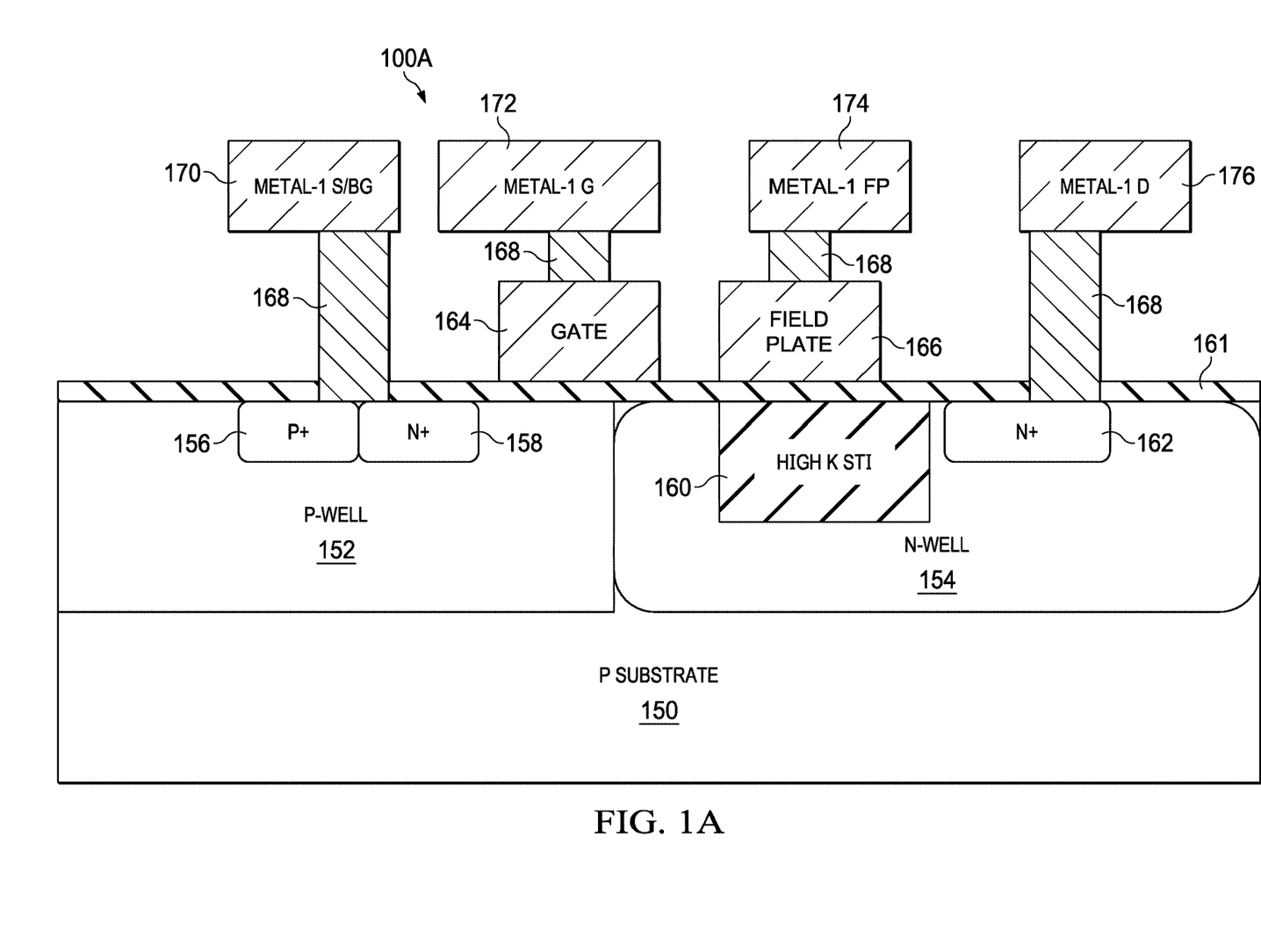
FIG. 1A depicts an example of an LDMOS transistor according to an embodiment of the disclosure.

FIG. 1A depicts a simplified example of an LDMOS transistor 100A that includes a field plate that is a separate structure from the gate according to an embodiment of the disclosure. LDMOS transistor 100A is fabricated on a P-type substrate 150 and has P-well 152 and N-well 154 formed near the surface of the chip. P+ region 156 and N+ region 158 are formed within P-well 152 to provide a source and a contact to the back gate; N+ region 162 is formed within N-well 154 to provide the drain. The only isolation trench shown in this embodiment is drain STI 160, which is filled with a high-k dielectric. The surface of substrate 150 is covered with a thin dielectric layer 161, which is typically silicon dioxide. Gate 164 and field plate 166 are formed on top of dielectric layer 161, with field plate 166 overlying high-k STI 160. Segments of the metal-1 layer provide coupling through contacts 168 to various elements of LDMOS transistor 100A. Segment 170 is coupled to the source 158 and back gate contact 156, segment 172 is coupled to gate 164, segment 174 is coupled to field plate 166 and segment 176 is coupled to drain 162. By providing the gate 164 and field plate 166 as separate entities, the increase in gate capacitance that the high-k dielectric introduces can be minimized. Gate 164 is generally formed of polysilicon. Field plate 166 can be formed of polysilicon, but the field plate can also be formed in metal. The specific materials utilized will depend on the needs of the system in which the LDMOS is to be utilized.

Figure 1B:
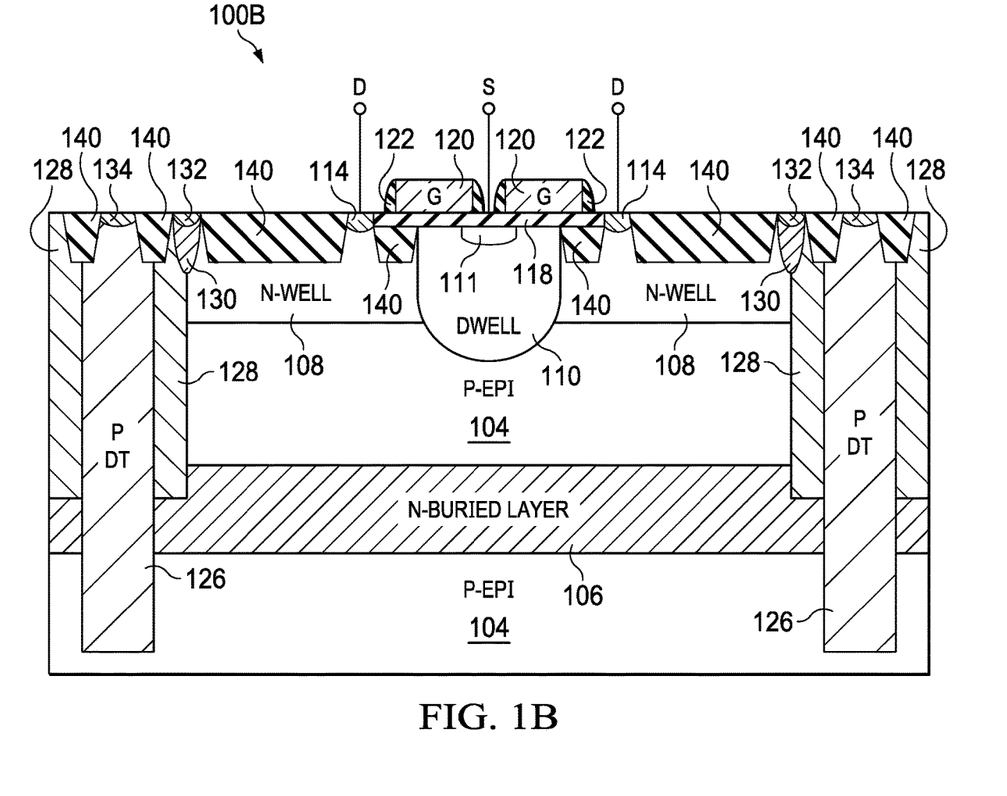
FIG. 1B depicts an example of an LDMOS transistor according to an embodiment of the disclosure.

FIG. 1B depicts an LDMOS transistor 100B according to another embodiment of the disclosure. The transistor shown in FIG. 1B is generally similar to the transistor shown in FIG. 1, except that all of the STI structures 140 are filled with a high-k dielectric material. This embodiment can be utilized in analog chips and power-intensive chips where the effects on other structures can be minimized. This embodiment also provides a cost savings, as an additional mask is not needed to provide only the drain STI with a high-k dielectric. It should be noted that while all of the STI dielectric material in the embodiment of FIG. 1B has been replaced with a high-k dielectric material, other dielectric material, such as the gate dielectric 118 and sidewall spacers 122, are still implemented in silicon dioxide.

Figure 2A:
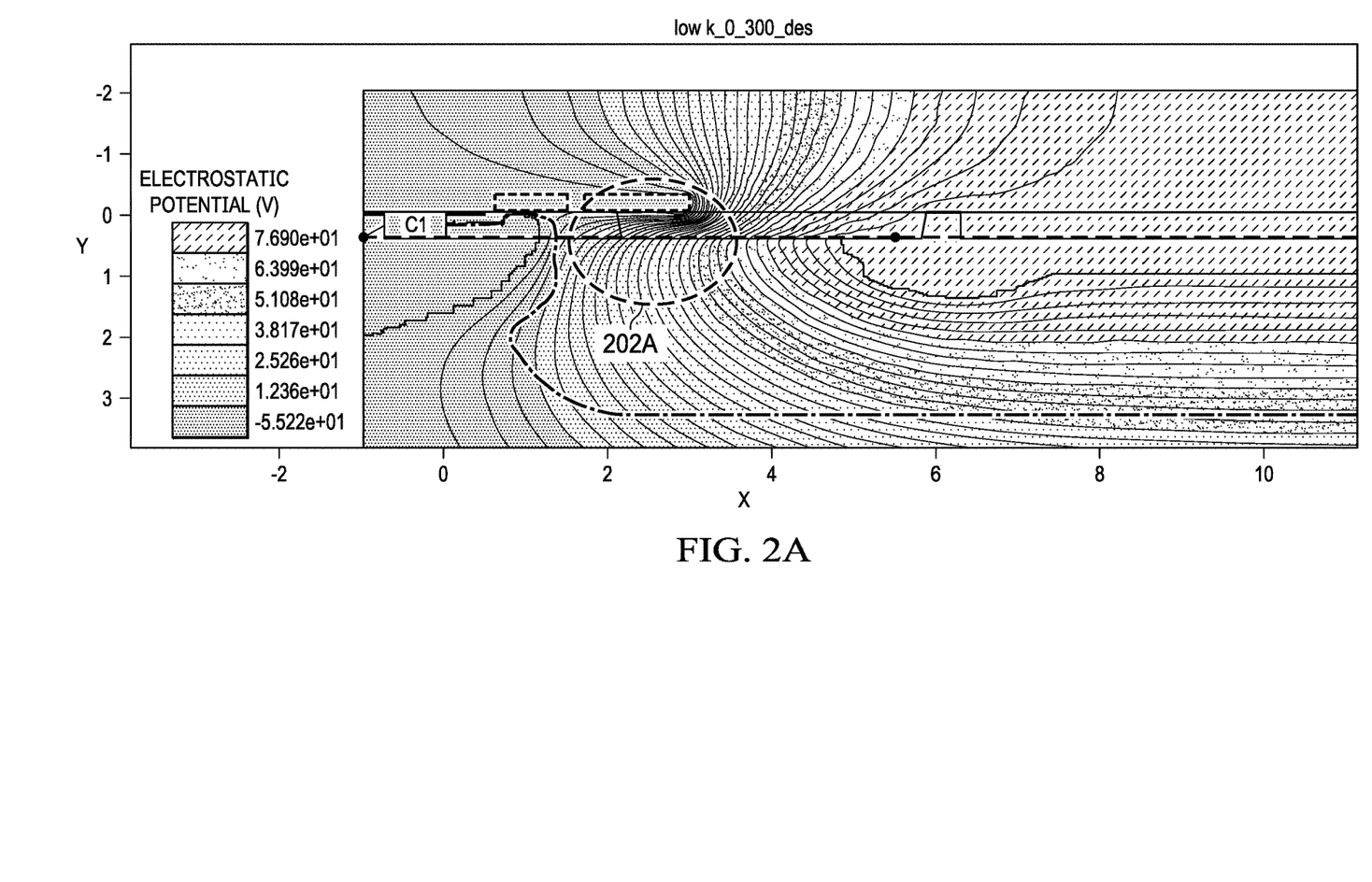
FIGS. 2A and 2B depict graphs of the lines of electrostatic potential under the field plate, first with an oxide dielectric and then with a nitride dielectric.
Figure 2B:
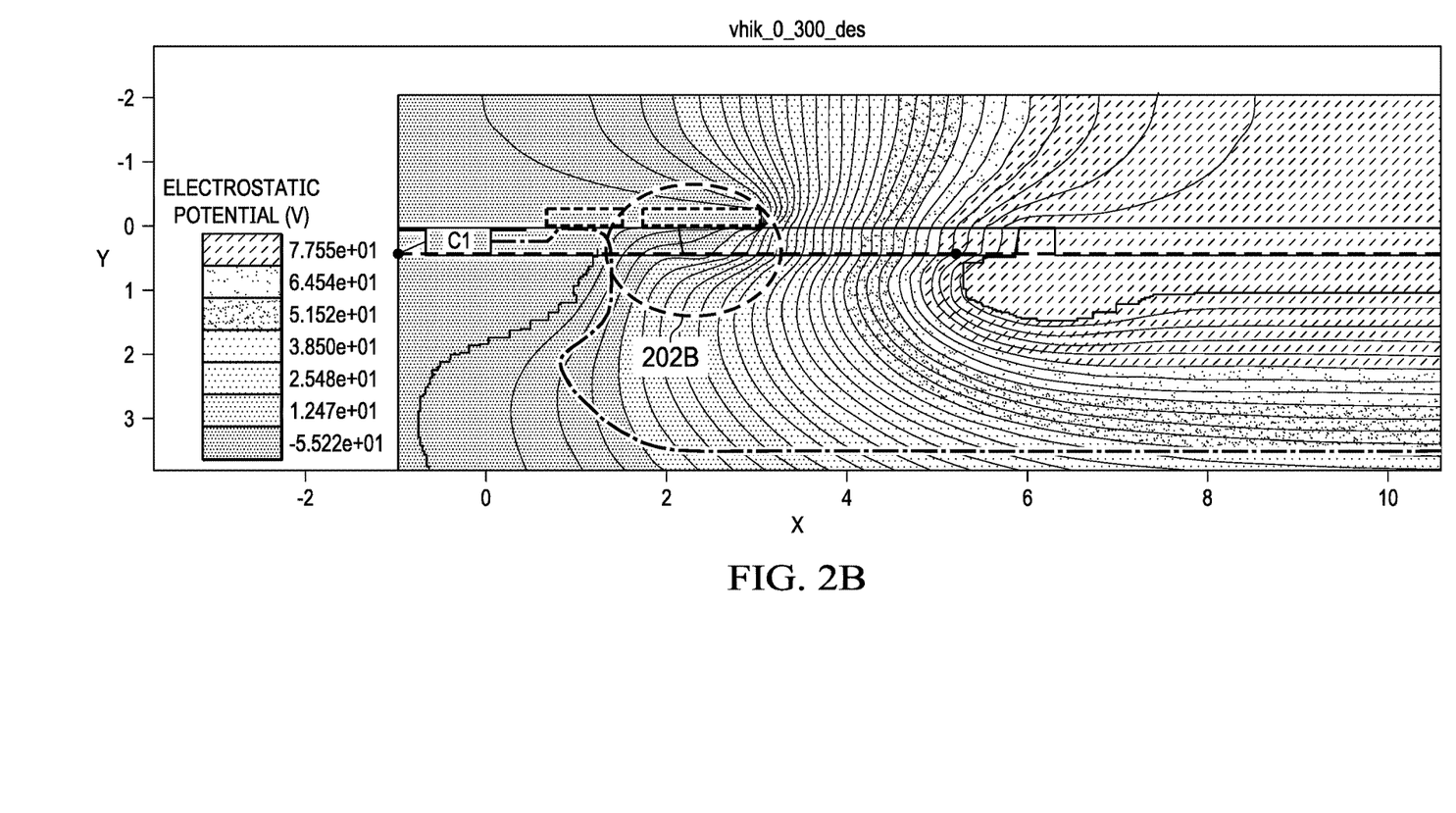

FIGS. 2A and 2B depict the electrostatic field around the edges of the field plate, with the field plate and underlying region in each figures being circled. FIG. 2A shows the field present when the drain STI is formed of silicon dioxide; here the field lines in region 202A are tightly packed. FIG. 2B shows the field present when the drain STI is formed of a high-k dielectric material, which in this case is nitride; the field lines in region 202B are much farther apart. It is clear from these two figures that the field is less crowded when the dielectric is nitride. Since this figure is illustrative of the results using silicon nitride, one can expect that with the other high-k dielectric materials, the difference will be even greater.

Tests were performed to understand the differences obtained with a drain STI that uses one of three different dielectric materials: silicon dioxide, silicon nitride and a high-k material having a dielectric constant of about 100 (e.g., hafnium oxide or tantalum pentoxide) for a 40 V LDMOS. The depth of the STI etch was the same in each of these examples, but the overlap of the field plate with the STI was decreased as the dielectric constant increased. As the dielectric constant of the drain dielectric increased, the breakdown voltage in the extended drain increased by nearly 8 percent for silicon nitride and by approximately 16 percent for hafnium oxide. At the same time, the specific ON resistance decreased by almost 15 percent for silicon nitride and by 20 percent for hafnium oxide.

Applicants note that in one embodiment, the increase in breakdown voltage was not needed. Therefore, conventional techniques were utilized to lower the breakdown voltage and determine the amount that the ON resistance was further lowered. The half pitch was decreased by a little over 4 percent in this embodiment. This decrease in half pitch was enough to drop the breakdown voltage back almost to the original value and further dropped the ON resistance to provide a total drop of 22 percent. Notably, this drop in ON resistance was accomplished with the addition of only a single mask to the process flow and without adversely affecting the breakdown voltage.

A further test was performed on SiN samples having differing etch depths and differing overlap between the field plate and STI; values for other high-k materials were also calculated, such as polysilicon (which acts as a dielectric only when the doping of the polysilicon is very, very low, with k=11.8), and very high-k dielectrics such as hafnium oxide and tantalum pentoxide (k=100). It was determined that the breakdown voltage strongly depends on both the etch depth for the drain STI and the overlap between the field plate and STI. Two further observations can also be made. Using SiN instead of oxide for the drain STI filling results in either a greater than 7 percent higher breakdown voltage, i.e., for the same depth of the drain STI, or in 20 percent lower ON resistance, i.e., for shallower STI depths.

While the previous paragraphs discussed testing for 40 volt embodiments, additional testing was performed for 85 volt embodiments. Replacing the oxide in the drain STI with silicon nitride provided a 15 percent lower $R_{SP}$. The original STI etch depth did not provide a desired $BV_{DSS}$ with silicon nitride, so the deep N-well dosage under the drain STI was decreased by increasing the etch for the drain STI.

Figure 3A:
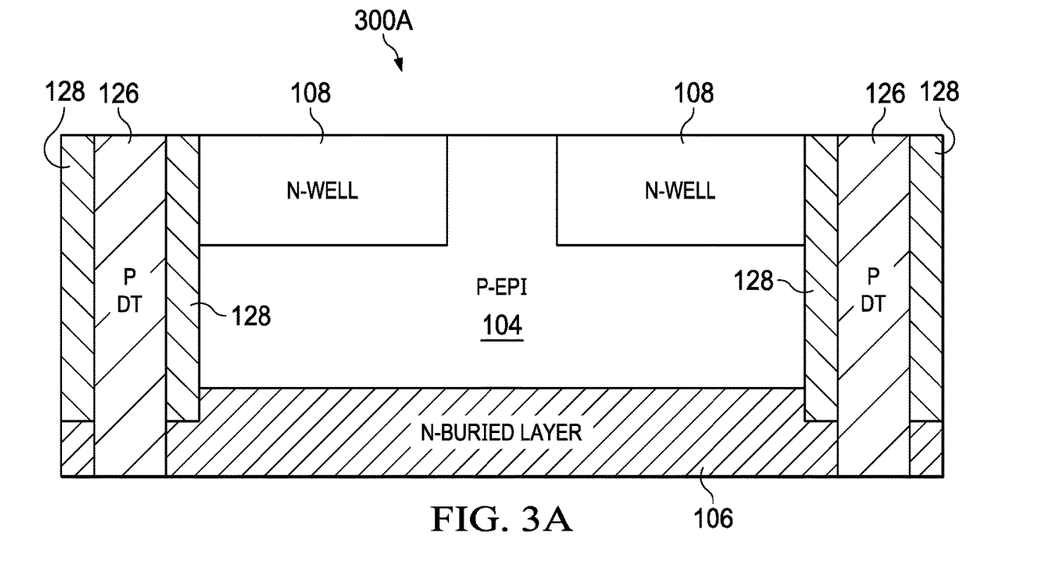
FIGS. 3A-3F depict various points in the process of fabricating the LDMOS transistor of FIG. 1 according to an embodiment of the disclosure.
Figure 3B:
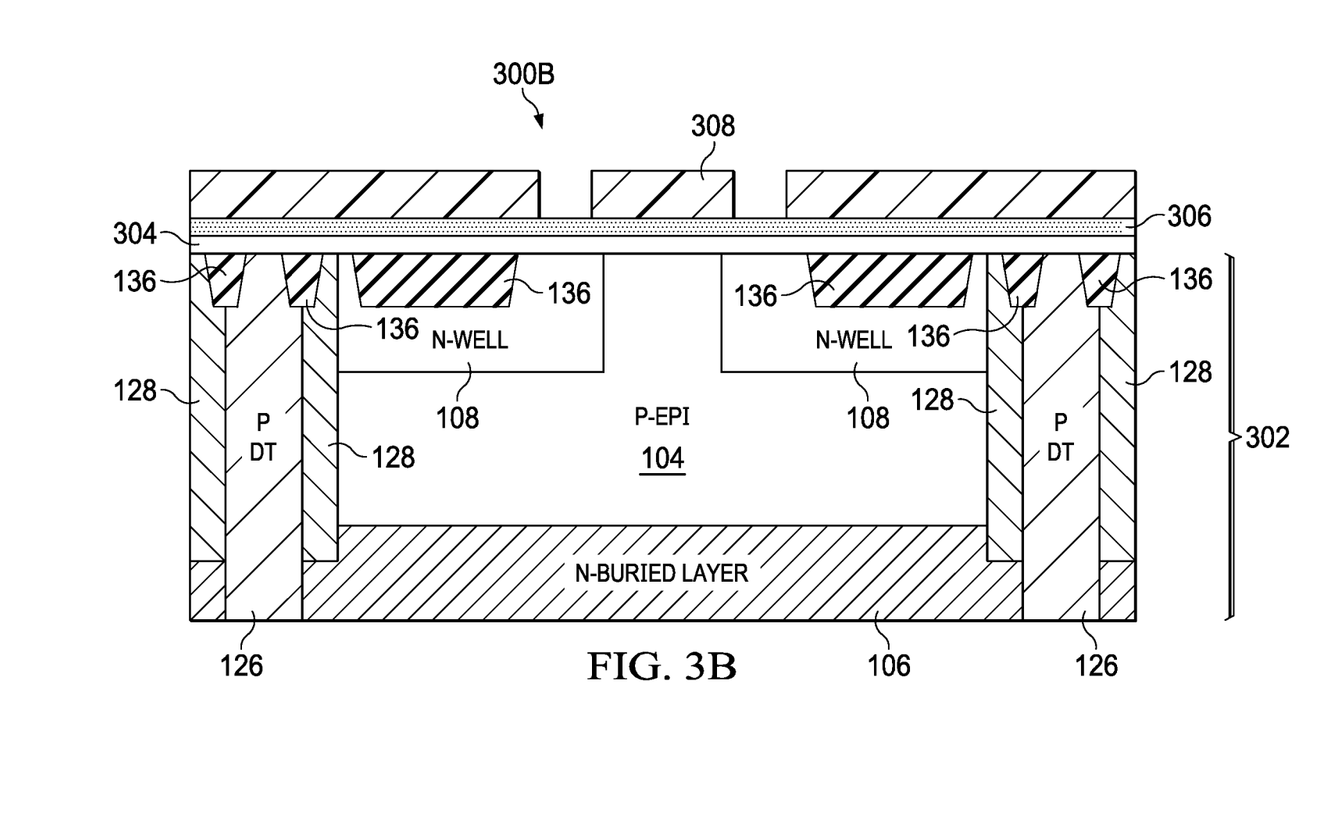
Figure 3C:
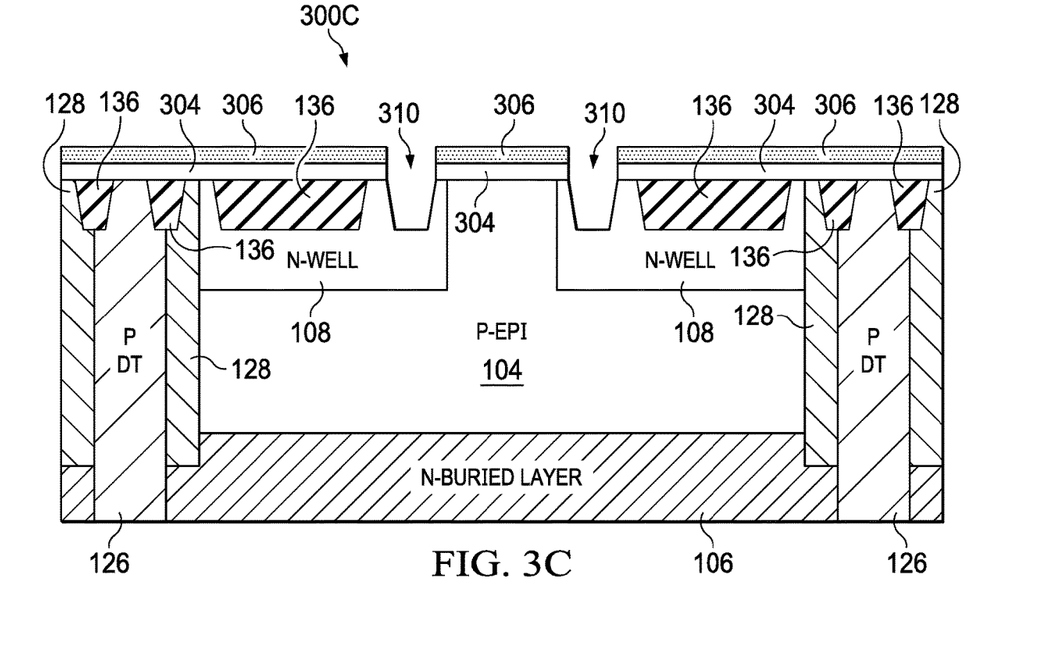
Figure 3D:
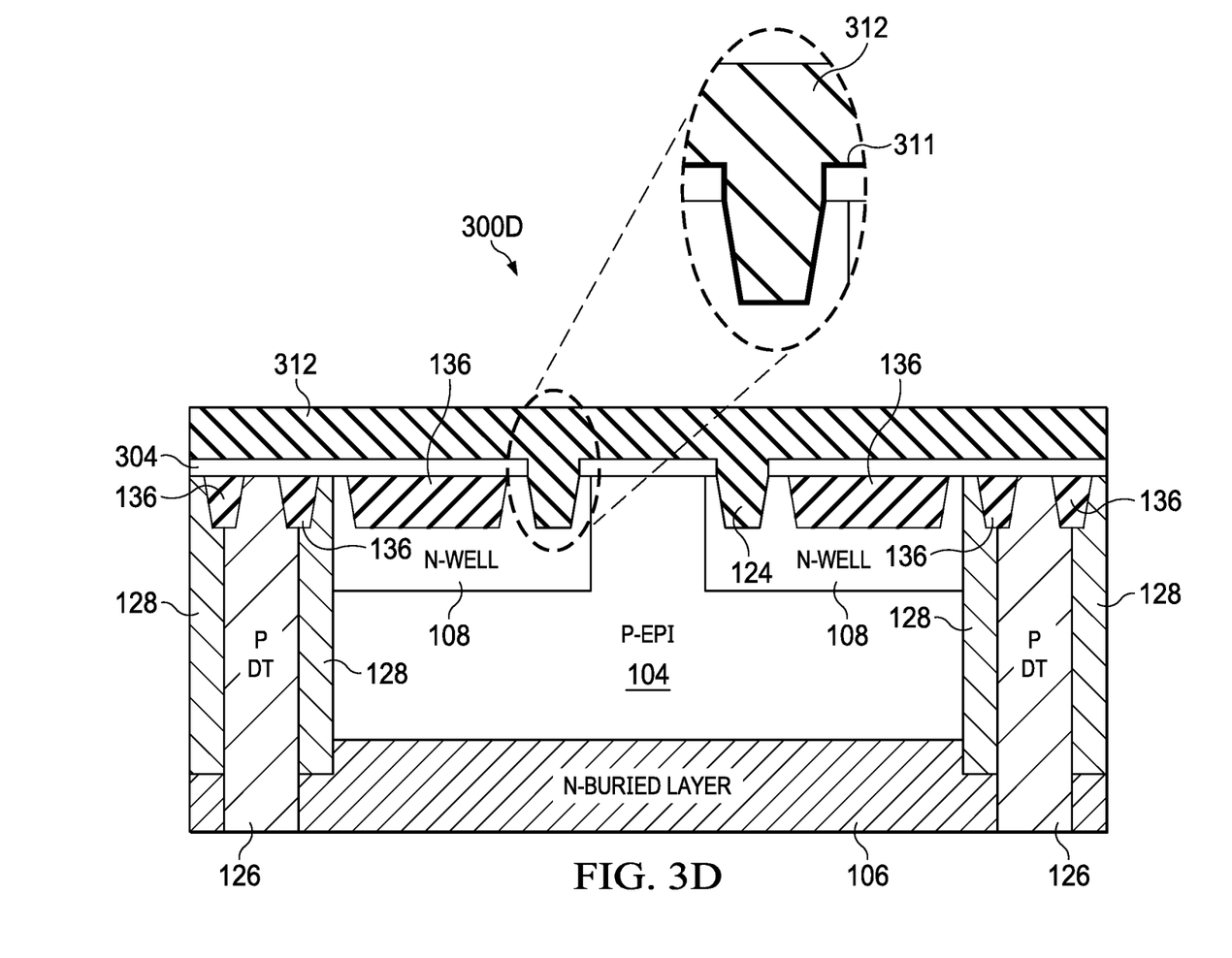
Figure 3E:
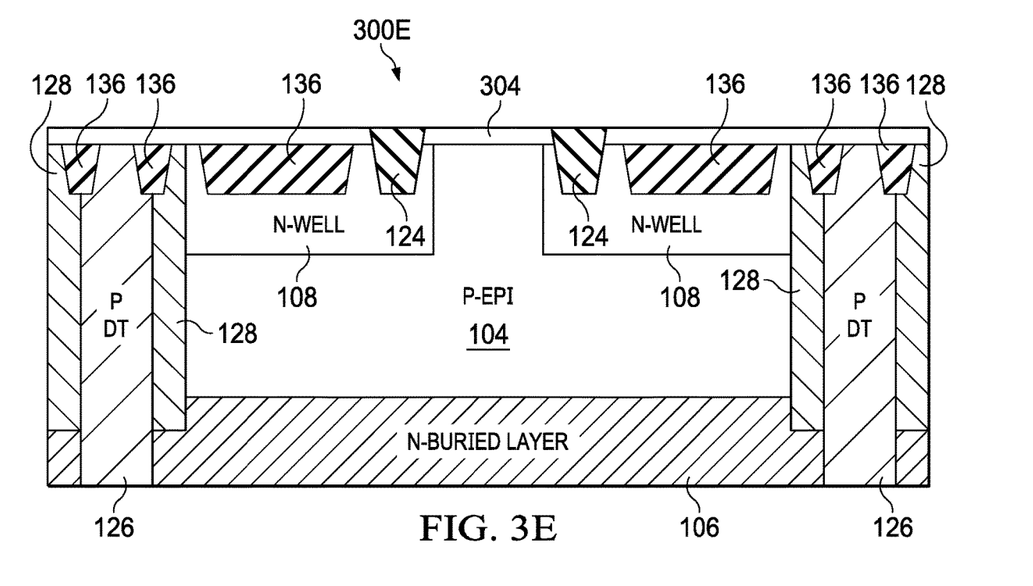
Figure 3F:
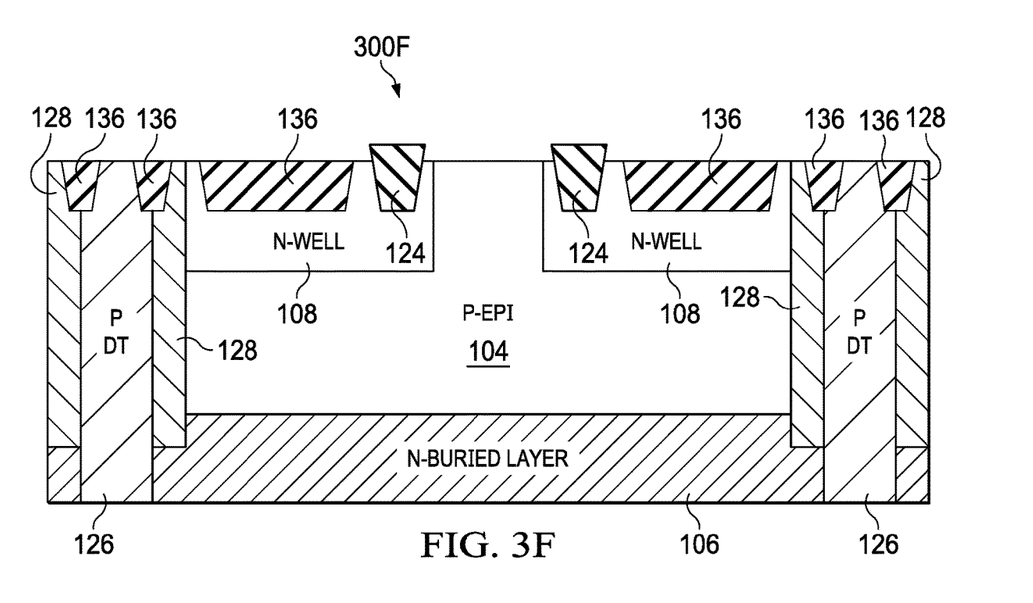
Figure 4:
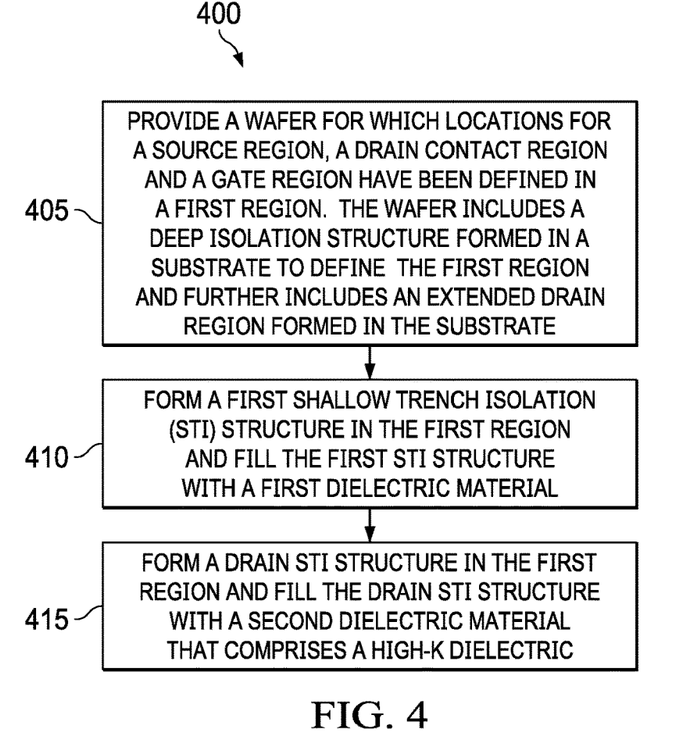
FIG. 4 depicts a flowchart of a method of fabricating an LDMOS transistor according to an embodiment of the disclosure.

The method of fabricating the LDMOS transistors of FIG. 1 will now be discussed with regard to FIGS. 3A-3F, which depict cross-sections of the LDMOS transistor at different points in time during the fabrication, and also with regard to FIG. 4, which depicts the method 400 of fabricating an LDMOS transistor in a first region of a wafer, e.g., the region shown in FIG. 1. The method 400 begins with providing (405) a wafer for which locations for a source region, a drain contact region and a gate region have been defined in the first region, although these regions have generally not been formed at the time the disclosed method is performed. The wafer includes a deep isolation structure formed in a substrate to define the first region and further includes an extended drain region formed in the substrate. In one embodiment, the disclosed method is added to an existing process flow at a point just prior to formation of the D-well. At this point, the wafer exists as shown in cross-section 300A of FIG. 3A. Applicants note that FIGS. 3A-3F are vertically truncated at the bottom of the N-type buried layer 106 to save space.

The method proceeds by forming (410) a first STI structure in the first region and filling the first STI structure with a first dielectric material. In one embodiment, the first dielectric material is silicon dioxide. The process of forming STI structures using silicon dioxide includes depositing and patterning a layer of photoresist and using the patterned photoresist to etch the desired STI trenches, then filling the trenches with silicon dioxide and performing chemical-mechanical polishing (CMP) to planarize the surface of the wafer. This process is well known and is neither elaborated further nor specifically illustrated herein. The specific location of the first STI structure or structures is dependent upon the specific layout being utilized; one possible layout of the first STI is illustrated in FIG. 3B, where STI structures 136 have been formed.

Figure 4A:
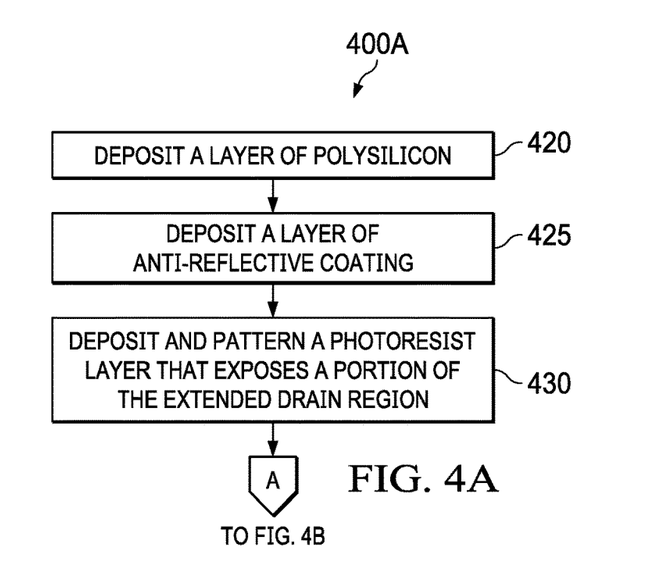
FIGS. 4A-4C depict in greater detail the flow of the method of forming a drain STI structure.
Figure 4B:
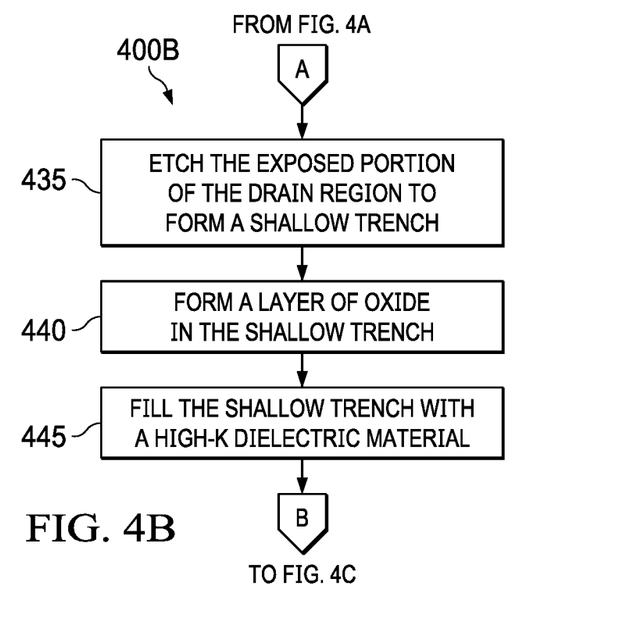
Figure 4C:
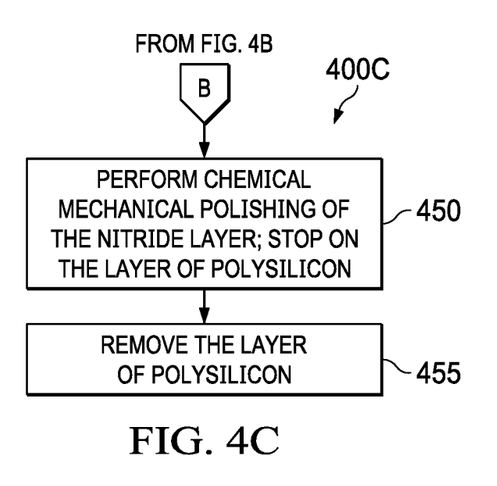

Once the first STI structure is completed, the method forms and fills (415) a drain STI structure using a second dielectric material. The second dielectric material is a high-k dielectric that has a dielectric constant that is greater than silicon dioxide. The actual process of fabricating the drain STI structure is discussed in greater detail with reference to FIGS. 4A-4C. In method 400A, fabrication of the drain STI structure begins with depositing (420) a layer of polysilicon 304. This will be a sacrificial layer, so the polysilicon can be either polycrystalline or amorphous. In one embodiment, the layer of polysilicon is deposited to a thickness of around 500 Å or greater. This is followed by depositing (425) a layer of an anti-reflective coating (ARC)(306). Finally, a layer of photoresist (308) is deposited and patterned (430) in order to expose a portion of the extended drain region where the drain STI is desired. A schematic cross-section 300B of the wafer at this point in time is shown in FIG. 3B.

Method 400B continues by etching the exposed portion of the extended drain region to form the desired shallow trench 310. In one embodiment, the etch process etches through 500 Å or greater of polysilicon and 2000-6000 Å of silicon. A cross-section 300C of the wafer after the etch process is shown in FIG. 3C. A thin layer of silicon dioxide 311 (seen in the enlargement of drain STI in FIG. 3D), e.g., less than or equal to 500 Å, is then formed (440) on the inside of trench 310. In one embodiment, the silicon oxide is thermally grown. The trench is then filled (445) with a high-k dielectric material 312, as seen in cross-section 300D of FIG. 3D. In one embodiment, a depth of silicon nitride that is a few microns greater than the STI trench depth is deposited in this step using, for example, plasma enhanced chemical vapor deposition (PECVD) and overfilling the trenches 310.

Method 400C then continues with performing (450) CMP on the nitride layer, with the layer of polysilicon 304 acting as a stop for the process. The wafer after CMP is illustrated in the cross-section 300E of FIG. 3E. In at least one embodiment, the slurry utilized to perform CMP has a high nitride to polysilicon selectivity. Once the CMP is completed, a wet etch is utilized to remove (455) the remaining layer of polysilicon 304 to provide the wafer cross-section 300F shown in FIG. 3F. In one embodiment, the wet etch is performed using an etchant that is highly selective to nitride and oxide. This completes the process of forming the drain STI structure and filling the drain STI structure. At this point, other processes are performed to form the D-well 110, source 111, drain contact 114 and other implantations and contacts as shown in FIG. 1. While these remaining processes are necessary for completion of the LDMOS transistor, the exact nature of the remaining processes is not part of the disclosed embodiments and their details are not elaborated.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A laterally diffused metal oxide silicon (LDMOS) transistor comprising:
   a drain drift region formed in a substrate and containing a drain contact region;
   a gate structure overlying a channel region in the substrate;
   a first shallow-trench isolation (STI) structure formed between the drain contact region and the channel region, the first STI structure comprising a high-k dielectric;
   a second STI structure comprising silicon dioxide that touches the drain contact region; and
   a double-diffused well (DWELL) within the channel region, the first STI structure extending from the drain contact region to the DWELL.

2. The LDMOS transistor as recited in claim 1 further comprising a field plate overlying the first STI structure.

3. The LDMOS transistor as recited in claim 1 wherein the gate structure at least partially overlies the first STI structure to form a field plate.

4. The LDMOS transistor as recited in claim 1 wherein the high-k dielectric is selected from a group comprising silicon nitride, aluminum oxide, hafnium dioxide, hafnium silicate, zirconium silicate, zirconium dioxide and ferroelectric materials.

5. The LDMOS transistor as recited in claim 1 further comprising a deep trench filed with P-type polysilicon and a sinker formed adjacent the deep trench and self-aligned with the deep trench, the sinker comprising N-type polysilicon, the sinker having a depth less than the depth of the deep trench.

6. The LDMOS transistor as recited in claim 5 wherein the second STI structure is positioned between the drain contact region and the sinker.

7. The LDMOS transistor as recited in claim 6 further comprising a third STI structure positioned at the junction of the deep trench and the sinker, the third STI structure being filled with silicon dioxide.

8. An integrated circuit comprising:
   a laterally diffused metal oxide silicon (LDMOS) transistor, including:
      a source region formed in a substrate;
      a drain drift region formed in the substrate and containing a drain contact region;
      a gate structure overlying a double-diffused well (DWELL) between the source region and drain contact region;
      a gate dielectric separating the gate structure from the channel region, the gate dielectric comprising silicon dioxide;
      a high-k STI structure touching the drain contact region and extending under the gate structure toward the DWELL; and
      a silicon oxide STI structure touching the drain contact region and extending away from the high-k STI structure.

9. The integrated circuit as recited in claim 8 wherein the LDMOS transistor further comprises a field plate overlying a drain STI structure of the plurality of STI structures.

10. The integrated circuit as recited in claim 8 wherein the gate structure at least partially overlies a drain STI structure of the plurality of STI structures to form a field plate.

11. The integrated circuit as recited in claim 8 wherein the high-k dielectric is selected from a group comprising silicon nitride, aluminum oxide, hafnium dioxide, hafnium silicate, zirconium silicate, zirconium dioxide and ferroelectric materials.

12. The integrated circuit as recited in claim 8 further comprising a deep trench filled with P-type polysilicon and a sinker formed adjacent the deep trench and self-aligned with the deep trench, the sinker comprising N-type polysilicon, the sinker having a depth less than the depth of the deep trench.

13. The integrated circuit as recited in claim 12 wherein the plurality of STI structures comprises a drain STI structure and an additional STI structure positioned between the drain contact region and the sinker.

14. The integrated circuit as recited in claim 13 wherein the plurality of STI structures further comprises a further additional STI structure positioned at the junction of the deep trench and the sinker.

15. An electronic device, comprising:
   an n-well within a semiconductor substrate;
   first and second shallow trench isolation (STI) structures within the n-well, the first STI structure including a high-k dielectric and the second STI structure including silicon oxide;

a gate electrode over the semiconductor substrate and extending partially over the n-well and the first STI structure;

an n+ region within the n-well and touching both the first and second STI structures; and a double-diffused well (DWELL) touching the first STI structure.

16. The electronic device as recited in claim 15 wherein the first STI structure has a first top surface and the second STI structure has a second top surface, the first top surface being higher above a top surface of the semiconductor substrate than the second top surface.

17. The electronic device as recited in claim 15 further comprising a gate structure extending over the DWELL and the first STI structure.

18. The electronic device as recited in claim 17, wherein the n+ region is a drain contact region and further comprising an n-type source region within the DWELL, wherein the gate structure extends over the source region.

19. The electronic device as recited in claim 15 wherein the high-k dielectric is selected from a group comprising silicon nitride, aluminum oxide, hafnium dioxide, hafnium silicate, zirconium silicate, zirconium dioxide and ferroelectric materials.

20. An electronic device, comprising:

an n-well within a semiconductor substrate;

first and second shallow trench isolation (STI) structures within the n-well, the first STI structure including a high-k dielectric and the second STI structure including silicon oxide;

a gate electrode over the semiconductor substrate and extending partially over the n-well and the first STI structure; and an n+ region within the n-well and touching both the first and second STI structures, wherein the first STI structure has a first top surface and the second STI structure has a second top surface, the first top surface being higher above a top surface of the semiconductor substrate than the second top surface.

21. The electronic device as recited in claim 20 wherein the high-k dielectric is selected from a group comprising silicon nitride, aluminum oxide, hafnium dioxide, hafnium silicate, zirconium silicate, zirconium dioxide and ferroelectric materials.

22. The electronic device as recited in claim 20, wherein the first STI structure is located between the n+ region and a DWELL.

* * * * *